United States Patent
Maki et al.

(10) Patent No.: US 7,857,189 B2
(45) Date of Patent: Dec. 28, 2010

(54) GOLD ALLOY WIRE FOR BONDING WIRE HAVING HIGH INITIAL BONDABILITY, HIGH BONDING RELIABILITY, HIGH ROUNDNESS OF COMPRESSION BALL, HIGH STRAIGHTNESS, AND HIGH RESIN FLOWABILITY RESISTANCE

(75) Inventors: Kazunari Maki, Naka-gun (JP); Yuji Nakata, Sanda (JP)

(73) Assignee: Tanaka Denshi Kogyo K.K., Chiyoda-Ku (JP)

( * ) Notice: Subject to any disclaimer, the term of this patent is extended or adjusted under 35 U.S.C. 154(b) by 0 days.

(21) Appl. No.: 11/917,233

(22) PCT Filed: Jun. 8, 2006

(86) PCT No.: PCT/JP2006/311524
§ 371 (c)(1),
(2), (4) Date: Oct. 14, 2008

(87) PCT Pub. No.: WO2006/134824
PCT Pub. Date: Dec. 21, 2006

(65) Prior Publication Data
US 2009/0101695 A1     Apr. 23, 2009

(30) Foreign Application Priority Data
Jun. 14, 2005  (JP) ................. P2005-173725

(51) Int. Cl.
*B23K 35/14* (2006.01)
*C22C 5/02* (2006.01)

(52) U.S. Cl. ............... 228/56.3; 420/508; 420/509; 420/510; 420/511

(58) Field of Classification Search .......... None
See application file for complete search history.

(56) References Cited

U.S. PATENT DOCUMENTS

| | | | |
|---|---|---|---|
| 2008/0050267 A1* | 2/2008 | Murai et al. | 420/508 |
| 2009/0120665 A1* | 5/2009 | Maki et al. | 174/126.1 |
| 2009/0232695 A1* | 9/2009 | Maki et al. | 420/509 |

FOREIGN PATENT DOCUMENTS

| | | | | |
|---|---|---|---|---|
| JP | 60112251 | A | | 4/1994 |
| JP | 8-109425 | A | | 4/1996 |
| JP | 8-109425 | A | * | 4/1996 |
| JP | 8-193233 | A | | 7/1996 |
| JP | 10-275820 | A | | 10/1998 |
| JP | 10-303235 | A | * | 11/1998 |
| JP | 11-45899 | A | | 2/1999 |
| JP | 11-45900 | A | | 2/1999 |
| JP | 11-45901 | A | * | 2/1999 |
| JP | 11-45901 | A | | 2/1999 |
| JP | 11214425 | A | | 8/1999 |
| JP | 11-288962 | | * | 10/1999 |
| JP | 2000-40710 | A | * | 2/2000 |

OTHER PUBLICATIONS

Machine translation of JP-11-214425A.*
Machine translation of JP-11-45901A.*
Machine translation of JP-8-109425A.*

* cited by examiner

*Primary Examiner*—Kiley Stoner
(74) *Attorney, Agent, or Firm*—Leason Ellis LLP.

(57) ABSTRACT

There is provided a gold alloy wire for a bonding wire having high initial bonding ability, high bonding reliability, high roundness of a compression ball, high straightness, and high resin flowability resistance. The gold alloy wire for a bonding wire comprises one kind or two kinds of Pt and Pd of 1000 to less than 5000 ppm in total, Ir: 1 to 200 ppm, Ca: 20 to 100 ppm, Eu: 10 to 100 ppm, Be: 0.1 to 20 ppm, if necessary, and La: 10 to 100 ppm, if necessary. The total amount of at least two kinds of Ca, Eu, Be, and La is in a range of 50 to 250 ppm.

2 Claims, No Drawings

GOLD ALLOY WIRE FOR BONDING WIRE HAVING HIGH INITIAL BONDABILITY, HIGH BONDING RELIABILITY, HIGH ROUNDNESS OF COMPRESSION BALL, HIGH STRAIGHTNESS, AND HIGH RESIN FLOWABILITY RESISTANCE

CROSS-REFERENCE TO PRIOR APPLICATION

This is a U.S. National Phase Application under 35 U.S.C. §371 of International Patent Application No. PCT/JP2006/311524 filed Jun. 8, 2006, which claims the benefit of Japanese Patent Application No. 2005-173725 filed Jun. 14, 2005, both of them are incorporated by reference herein. The International Application was published in Japanese on Dec. 21, 2006 as WO 2006/134824 A1 under PCT Article 21(2).

TECHNICAL FIELD

The present invention relates to a gold alloy wire for a bonding wire having high initial bonding ability, high bonding reliability, high roundness of a compression ball, high straightness, and high resin flowability resistance for connecting a chip electrode of semiconductor devices such as a transistor, an LSI, or an IC which can be used under a high-temperature environment (for example, the high-temperature environment in an automobile parked in an open parking lot in the summer, in which the temperature becomes as high as more than 60 to less than 100° C.) to an exterior lead part and, and in particular, relates to a gold alloy wire for a bonding wire which can be used under a high-temperature environment and has a fine wire diameter of less than 20 µm.

BACKGROUND ART

Recently, semiconductor devices such as a transistor, an LSI, or an IC are used under a high-temperature environment (for example, the high-temperature environment in the vicinity of an automobile engine in which the temperature becomes as high as more than 60 to less than 100° C.), and an operating temperature of a high frequency IC tends to be increasingly high. Therefore, even though the semiconductor devices are exposed to the high-temperature environment, a high degree of reliability is required.

As a gold alloy wire for a bonding wire for connecting an electrode on an IC chip which is used under the high-temperature environment to an exterior lead part, a gold alloy wire for a bonding wire (see patent reference 1) having a component composition comprising at least one kind of Pd, Pt, Rh, Ir, Os, and Ru of 1000 ppm to 5% by mass in total, at least one kind of Ca, Be, Ge, Si, Fe, Y, and rare earth elements of 1 to 50 ppm in total, and the balance being Au and inevitable impurities has been known. A gold alloy wire having a component composition comprising at least one kind or two kinds of Pd, Pt, Rh, Ir, and Ru of 1 to 5000 ppm in total, at least one kind or two kinds of Ca, Be, Ge, Si, In, and Ag of 0.2 to 100 ppm in total, at least one kind or two kinds of rare earth elements of 0.2 to 100 ppm in total, at least one kind or two kinds of Cu, Pb, Li, Ti of 0.2 to 100 ppm in total and the balance being Au and inevitable impurities has been known (see patent reference 2). The gold alloy wire for the bonding wire as described above contains a large amount of platinum group metals to improve bonding strength of a compression ball and an Al pad at a high temperature, and further contains Ca, Be, or the like to increase hardness and improve stability of a loop. Generally, in order to connect the electrode on the IC chip to the exterior lead part by using the gold alloy wire for the bonding wire, a method of bonding the gold alloy wire by an ultrasonic wave-combined thermal compression has been mainly used.

[Patent Reference 1]
Japanese Unexamined Patent Application, First Publication No. Hei 06-112251
[Patent Reference 2]
Japanese Unexamined Patent Application, First Publication No. Hei 08-193233

DISCLOSURE OF INVENTION

Problems to be Solved by the Invention

Recently, as the integration of the semiconductor devices increases, an area of an Al pad becomes small. Thus, high initial joint properties (compression balls are kept from being stripped off from the Al pad during the bonding of balls on the Al pad) have been required for a small joint area under a low temperature.

Further, the decrease of bonding strength due to a ball bonding or the occurrence of bonding malfunction due to rising of electrical resistance at the bonding interface has been problematic in an automobile IC which requires a high reliability and a high frequency IC in which the operating temperature increases in a high-temperature environment. Since the bonding malfunction is likely to occur gradually due to the deterioration of bonding conditions such as the low temperature joint or a shrinking of the bonding areas, it is required to ensure the higher bonding reliability (persistence of the bonding strength or electrical resistance due to the ball bonding at the bonding interface under some environments) than that of the related art.

In addition, the roundness of the compression balls is low in bonding the ball, a portion of the compression balls are protruded from the Al pad, and a short malfunction occurs by the contact of a neighboring compression ball. As a result, the short malfunction is likely to increase by the shrinking of the Al pad area and a bonding pad pitch. Therefore, it is required that the roundness of the compression ball is higher than that of the related art compression ball.

Furthermore, at the same time the length of a wire loop (hereinafter, referred to as a loop length) for connecting the chip electrodes of the semiconductor devices to the outer lead becomes long, the distance between the wire loop and a neighboring loop parallel to the wire loop becomes narrow. In order to cope with the above-described states, it tends to increasingly decrease the diameter of the gold alloy wire used as a bonding wire. However, when the gold alloy wire having a rolled thin diameter is extracted from a spool, a curling or meandering (curvature or bending) may easily occur in the gold alloy wire. When the bonding is conducted by using the gold alloy wire in which the curling or meandering (curvature or bending) exists, since the neighboring bonding wires contact, a short occurs, inferior or defective semiconductor chips are produced, and thus the yield ratio is reduced. More particularly, when the diameter of the bonding wire made of the gold alloy is less than 20 µm, the curling or meandering (curvature or bending) may easily occur in the wire directly after being unreeled from the spool. The loop formed by the bonding without the occurrence of the curling or meandering (curvature or bending) in the wire directly after being unreeled from the spool does not contact the neighboring loop. The above-described property is referred to as the straightness. When straightness is insufficient, since the loop contacts the neighboring loop and causes a short, the inferior or defective semiconductor devices are produced to reduce the yield ratio.

In addition, the loop is formed by bonding the wire, and then being molded by the resin. However, at this time, when the bonding wire is influenced by the resin, since the bonding wire contacts the neighboring loop and causes a short, the inferior or defective semiconductor devices are produced to reduce the yield ratio. With respect to the resin flow, when the diameter of the conventional gold alloy wire for the bonding wire is 25 μm or 30 μm, the resin flow is hardly a problem. However, as the high integration of the semiconductor devices increases, the distance of the chip electrodes of the semiconductor devices becomes narrow. In order to cope with the high integration of the semiconductor devices, the bonding is performed by using the wire having a thin diameter. However, when the wire diameter is less than 20 μm, the loop is easily influenced during the molding of the resin. Accordingly, it is necessary to have the property (hereinafter, referred to as a resin flowability resistance) in which resin flow is difficult to produce, even though the wire has a thin diameter.

As described above, the gold alloy wire for the bonding wire described in patent reference 1 and patent reference 2 does not sufficiently address the rigorous requirements of the recent years. The object of the present invention can satisfy the above-described requirements and provides a gold alloy wire as an excellent bonding wire having higher initial bonding ability, higher bonding reliability, higher roundness of a compression ball, higher straightness, and higher resin flowability resistance Means for Solving the Problems The inventors have done research so as to develop a gold alloy wire for a bonding wire having high initial bonding ability, high bonding reliability, high roundness of a compression ball, high straightness, and high resin flowability resistance. The results obtained by the research are as follows:

(A) A gold alloy wire has a composition comprising one kind or two kinds of Pt and Pd of 1000 to 5000 ppm in total, Ir: 1 to 200 ppm, Ca: 20 to 100 ppm, and Eu: 10 to 100 ppm in a high-purity gold having purity of 99.999% by mass. The above gold alloy wire has high initial bonding ability, high bonding reliability, high roundness of a compression ball, high straightness, and high resin flowability resistance.

(B) The gold alloy wire having the composition described in (A) further comprises Be: 0.1 to 20 ppm. Since Be distorts a crystal lattice of Au so as to improve the mechanical strength of the gold alloy wire for the bonding wire and work hardening ability of a free-air ball, to lower a re-crystallizing temperature, and to raise the height of loop to realize the proper height of loop, Be can be added according to need.

(C) The gold alloy wire having the composition described in (A) further comprises La: 10 to 100 ppm. Since La increases the mechanical strength of the gold alloy wire for the bonding wire while raising the re-crystallizing temperature, and lowers the height of loop of the gold alloy wire, La is added according to need.

(D) It is preferable that the total amount of Ca, Eu, Be, and La is in a range of 50 to 250 ppm.

(E) Even though Ag: 1 to 10 ppm is contained in the gold alloy wire described in (A) to (D) having high initial bonding ability, high bonding reliability, high roundness of a compression ball, high straightness, and high resin flowability resistance, it has little influence on the properties.

The invention based on the above-described research results is as follows:

(1) A gold alloy wire for a bonding wire having high initial bonding ability, high bonding reliability, high roundness of a compression ball, high straightness, and high resin flowability resistance has a component composition comprising one kind or two kinds of Pt and Pd of 1000 to less than 5000 ppm in total, Ir: 1 to 200 ppm, Ca: 20 to 100 ppm, Eu: 10 to 100 ppm, and the balance being Au and inevitable impurities.

(2) A gold alloy wire for a bonding wire having high initial bonding ability, high bonding reliability, high roundness of a compression ball, high straightness, and high resin flowability resistance has a component composition comprising one kind or two kinds of Pt and Pd of 1000 to less than 5000 ppm in total, Ir: 1 to 200 ppm, Ca: 20 to 100 ppm, Eu: 10 to 100 ppm, Be: 0.1 to 20 ppm, and the balance being Au and inevitable impurities.

(3) A gold alloy wire for a bonding wire having high initial bonding ability, high bonding reliability, high roundness of a compression ball, high straightness, and high resin flowability resistance has a component composition comprising one kind or two kinds of Pt and Pd of 1000 to less than 5000 ppm in total, Ir: 1 to 200 ppm, Ca: 20 to 100 ppm, Eu: 10 to 100 ppm, La: 10 to 100 ppm, and the balance being Au and inevitable impurities.

(4) A gold alloy wire for a bonding wire having high initial bonding ability, high bonding reliability, high roundness of a compression ball, high straightness, and high resin flowability resistance has a component composition comprising one kind or two kinds of Pt and Pd of 1000 to less than 5000 ppm in total, Ir: 1 to 200 ppm, Ca: 20 to 100 ppm, Eu: 10 to 100 ppm, Be: 0.1 to 20 ppm, La: 10 to 100 ppm, and the balance being Au and inevitable impurities.

(5) The gold alloy wire for the bonding wire having high initial bonding ability, high bonding reliability, high roundness of the compression ball, high straightness, and high resin flowability resistance according to any one of (1) to (4), the total amount of at least two kinds of Ca, Eu, Be, and La may be in a range of 50 to 250 ppm.

(6) The gold alloy wire for the bonding wire having high initial bonding ability, high bonding reliability, high roundness of the compression ball, high straightness, and high resin flowability resistance according to any one of (1) to (5) may further comprise Ag: 1 to 10 ppm.

In a method of manufacturing a gold alloy wire for a bonding wire for annealing gold alloy wire materials obtained by conducting a drawing process the gold alloy wire materials having the component composition described in (1) to (6) so as to have a predetermined diameter, when 0.2% proof strength (Pa) of the gold alloy wire for the bonding wire is $\sigma_{0.2}$, Young's modulus (Pa) is E, and fracture elongation percentage is $E_L$, it may obtain the gold alloy wire for the bonding wire satisfying the following equations under an annealing temperature of 550° C. or less which is lower than the related art annealing temperature:

$$E \geq 75 \text{ GPa},$$

$$(\sigma_{0.2}/E) \geq 2.2 \times 10^{-3}, \text{ and}$$

$$2\% \leq E_L \leq 10\%$$

It is more preferable that a reduction ratio by one die during the drawing process is 5% or less which is lower than the related art reduction ratio. The gold alloy wire for the bonding wire for satisfying the above-described conditions has higher straightness and higher resin flowability resistance.

(7) Accordingly, in the gold alloy wire having high initial bonding ability, high bonding reliability, high roundness of the compression ball, high straightness, and high resin flowability resistance according to any one of (1) to (6), when 0.2% proof strength (Pa) of the gold alloy wire for the bonding wire is $\sigma_{0.2}$, Young's modulus (Pa) is E, and fracture elongation percentage is $E_L$, the following equations are satisfied.

$E \geqq 75$ GPa, $(\sigma_{0.2}/E) \geqq 2.2 \times 10^{-3}$, and $2\% \leqq E_L \leqq 10\%$ Hereinafter, the reason why the component composition of the gold alloy wire for the bonding wire according to the invention having high initial bonding ability, high bonding reliability, high roundness of a compression ball, high straightness, and high resin flowability resistance is limited, as described above, will be explained.

[I] Component Composition (a) Pt and Pd:

Both Pt and Pd, which form a complete solid solubility with Au, cause the deterioration of the bonding strength of the compression ball and Al pad to inhibit and improve the bonding reliability. The layered-shape phase including Pt or Pd is formed in the vicinity of a bonding interface to act as a layer (so called, barrier layer with respect to Au diffusion) for decreasing a diffusion velocity of Au, thereby inhibiting the generating velocity of voids generating in the bonding part in accordance with the diffusion of Au. Accordingly, it is considered that Pt and Pd inhibit the deterioration of the bonding strength of the compression ball and Al pad and improve the bonding reliability. As the amount of Pt or Pd is rich, the effect for inhibiting (improving the bonding reliability) the deterioration of the bonding strength grows higher. However, when the total amount of one kind or two kinds of Pt and Pd is less than 1000 ppm, the effect for inhibiting the deterioration of the bonding strength is limited, while when the total amount of one kind or two kinds of Pt and Pd is 5000 ppm or greater, initial bonding ability of the gold alloy wire is significantly deteriorated. For this reason, it is not preferable that the total amount of one kind or two kinds of Pt and Pd be less than 1000 ppm or 5000 ppm or greater. Accordingly, the total amount of one kind or two kinds of Pt and Pd is set within the range of 1000 to less than 5000 ppm.

(b) Ir:

Ir inhibits the growth of grains (coarsening of grains). For this reason, when forming a free-air ball, it prevents the grain of a wire part (heat-affected part) directly on the ball from being coarsened due to the effect of heat on the ball, and the solidified free-air ball is formed from a great number of fine grains. In addition, the compression ball evenly extends in a radial pattern, thereby improving the roundness of the compression ball. However, when the amount of Ir is less than 1 ppm, it may not obtain a predetermined effect. Meanwhile, when the amount of Ir is greater than 200 ppm in the gold alloy wire for the bonding wire containing one kind or two kinds of Pt and Pd of 1000 to 5000 ppm in total, the effects are saturated and are not apparently improved, thus causing IC chips to destruct or impair. Accordingly, the amount of Ir is set within the range of 1 to 200 ppm.

(c) Ca:

Ca which serves as an alkali earth metal and has the metal bond radius larger than that of Au distorts the crystal lattice of Au, thereby increasing the mechanical strength of the gold alloy wire for the bonding wire and work hardening ability of the free-air ball, raising the re-crystallizing temperature, and lowering the height of loop of the gold alloy wire. However, when the amount of Ca is less than 20 ppm, since work hardening ability of the free-air ball is low, initial bonding ability and the strength are low, thus, it is difficult to satisfy the conditions of $E \geqq 75$ GPa, $(\sigma_{0.2}/E) \geqq 2.2 \times 10^{-3}$, and $2\% \leqq E_L \leqq 10\%$. Therefore, the straightness and resin flowability resistance are reduced. Meanwhile, when the amount of Ca is greater than 100 ppm, a number of oxides are generated at the surface of the free-air ball during the bonding of balls, and large shrinkage holes, which do not contribute to the bonding, are formed at the bottom-center of the free-air ball. Accordingly, the amount of Ca is set within the range of 20 to 100 ppm.

(d) Eu:

Eu has a metal bond radius larger than that of Au, thus distorting the crystal lattice of Au, increasing the mechanical strength of the gold alloy wire for the bonding wire and the work hardening ability of free-air ball, raising the re-crystallizing temperature, and lowering the height of loop of the gold alloy wire. Further, a metallic bonding radius of Eu is especially larger than other rare earth elements, so that the above-described effect is very large. However, when the amount of Eu is less than 10 ppm, since work hardening ability of the free-air ball is low, so that the initial bonding ability and the strength are reduced; therefore, it is difficult to satisfy the conditions of $E \geqq 75$ GPa, $(\sigma_{0.2}/E) \geqq 2.2 \times 10^{-3}$, and $2\% \leqq E_L \leqq 10\%$. As a result, the straightness and resin flowability resistance are reduced. Meanwhile, when the amount of Eu is greater than 100 ppm, a number of oxides are generated on the surface of free-air ball during the bonding of balls, and the initial bonding ability of the bonding of balls is deteriorated since large shrinkage holes, which do not contribute to the bonding, are formed at the bottom-center of the free-air ball. Accordingly, the amount of Eu is set within the range of 10 to 100 ppm.

(e) Be:

Be has the metal bond radius smaller than that of Au and distorts the crystal lattice of Au, thereby increasing the mechanical strength of the gold alloy wire for the bonding wire and the work hardening ability of free-air ball. In a case of containing Be together with Ca and Eu, since the re-crystallizing temperature lowers and the height of loop rises to realize the proper height of loop, it is possible to add according to need. However, when the amount of Be is less than 0.1 ppm, it may not obtain a predetermined effect. Meanwhile, when the amount of Be is greater than 20 ppm, a number of oxides are generated on the surface of free-air ball during the bonding of balls, and the initial bonding ability of the bonding of balls is deteriorated since large shrinkage holes, which do not contribute to the bonding, are formed at the bottom-center of the free-air ball, and the size of grains of the directly upper part of ball and the ball part increases, thus deteriorating the roundness of the compression ball part. Accordingly, the amount of Be is set within the range of 0.1 to 20 ppm.

(f) La:

La is added according to need in order to increase the mechanical strength of the gold alloy wire for the bonding wire and the work hardening ability of the free-air ball, raise the re-crystallizing temperature, and lower the height of the loop of the gold alloy wire. However, when the amount of La is less than 10 ppm, it may not obtain a predetermined effect. Meanwhile, when the amount of La is greater than 100 ppm, a number of oxides are generated on the surface of free-air ball during the bonding of the balls, and the initial bonding ability of the bonding of balls is deteriorated since large shrinkage holes, which do not contribute to the bonding, are formed at the bottom-center of the free-air ball. Accordingly, the amount of La is set within the range of 10 to 100 ppm.

(g) $50 \leq Ca+Eu+Be+La \leq 250$

According to the invention, it is preferable that the total amount of Ca, Eu, Be, and La is in the range of 50 to 250 ppm. This is because, when the total amount of Ca, Eu, Be, and La is less than 50 ppm, work effect of the free-air ball is low, so that the initial bonding ability and the strength are reduced. Therefore, it is difficult to realize the conditions of $E \geq 75$ GPa, $(\sigma_{0.2}/E) \geq 2.2 \times 10^{-3}$, and $2\% \leq E_L \leq 10\%$, resulting in deteriorating the straightness and resin flowability resistance. In addition, when the total amount of Ca, Eu, Be, and La is greater than 250 ppm, a number of oxides are generated on the surface of free-air ball during the bonding of balls, and the initial bonding ability of the bonding of balls is deteriorated since large shrinkage holes, which do not contribute to the bonding, are formed at the bottom-center of the free-air ball.

Ag:

Even though Ag of 1 to 10 ppm is contained, it has little influence on the properties. Accordingly, Ag is added according to need. However, when Ag exceeds 10 ppm, it is likely the initial bonding ability of the bonding of the balls is deteriorated.

[II] Mechanical Property

All of the gold alloy wires for the bonding wire containing the above-described component composition have high bonding reliability, high roundness of a compression ball, high straightness, and high resin flowability resistance. However, when manufacturing the gold alloy wire for the bonding wire so as to satisfy the conditions of $E \geq 75$ GPa, $(\sigma_{0.2}/E) \geq 2.2 \times 10^{-3}$, and $2\% \leq E_L \leq 10\%$ by defining 0.2% proof strength (Pa) of the gold alloy wire as $\sigma_{0.2}$, Young's modulus (Pa) as E, and fracture elongation percentage as $E_L$, all of the gold alloy wires for the bonding wire containing the above-described component composition have higher straightness and higher resin flowability resistance.

The reason is as follows:

In case of E<75 GPa, that is, when Young's modulus (Pa) is low, the bonded gold alloy wire largely flows by the resin (that is, the resin flow is large) during molding after the wire bonding, thereby the contact frequency and short frequency of the gold alloy wires adjacent to each other are increased. Therefore, the yield ratio of semiconductor chips is reduced. When $\sigma_{0.2}/E$ is more than $2.2 \times 10^{-3}$, the straightness rapidly is improved, and when the fracture elongation percentage is less than 2%, the residual distortion of the gold alloy wire after drawing the wire resides after annealing, resulting in reducing the straightness. In addition, when the fracture elongation percentage is higher than 10%, most of the conditions of E<75 GPa and $(\sigma_{0.2}/E)<2.2 \times 10^{-3}$ are satisfied. Therefore, either the straightness is reduced or the resin flow is increased.

According to the invention, the fracture elongation percentage $E_L$ (%), the 0.2% proof strength $\sigma_{0.2}$ (Pa), and the Young's modulus (Pa) of the gold alloy wire for the bonding wire are measured by tensioning the gold alloy wire up to be fractured by a tension tester in the conditions of the distance between gauge points: 100 mm and a tension velocity: 10 mm/minute at a room temperature.

Here, strain and tension stress are defined as follows. Strain=the elongation (mm) of the gold alloy wire for the bonding wire/100 mm, and tension stress (Pa)=tension load (N)/initial sectional area (m$^2$) of the gold alloy wire for the bonding wire. In addition, the fracture elongation percentage $E_L$ (%), the 0.2% proof strength $\sigma_{0.2}$ (Pa), and the Young's modulus (Pa) are defined as follows. The fracture elongation percentage $E_L$ (%)=strain when the gold alloy wire is fractured×100=[elongation (mm) when the gold alloy wire is fractured/100 (mm)]×100. The 0.2% proof strength $\sigma_{0.2}$ (Pa): tension stress (Pa) in applying a permanent deformation of 0.2% to the gold alloy wire for the bonding wire. In addition, the Young's modulus (Pa): the ratio of tension stress and strain, that is, tension stress (Pa)/strain, in the range where tension stress and strain are in direct proportion.

Effects of the Invention

As described above, the gold alloy wire for the bonding wire is excellent in high initial bonding ability, bonding reliability, high roundness of a compression ball, high straightness, and high resin flowability resistance. In addition, the yield ratio of the semiconductor devices can be improved by performing the bonding by using the gold alloy wire. Accordingly, the gold alloy wire for the bonding wire according to the invention has especially excellent effects in an industry.

BEST MODE FOR CARRYING OUT THE INVENTION

A gold alloy wire having a wire diameter: 19 μm was manufactured by a drawing process a gold alloy wire material having a wire diameter: 50 μm and having component compositions indicated in Tables 1 to 3 at a reduction ratio of 4.8%. Further, gold alloy wires for a bonding wire according to the invention (hereinafter, referred to as wires according to the invention) 1 to 27, comparative gold alloy wires for a bonding wire (hereinafter, referred to as comparative wires) 1 to 19, and the related art gold alloy wire for a bonding wire (hereinafter, referred to as the related art wire) 1 were manufactured by annealing the gold alloy wire at temperature indicated in Tables 4 to 6, and taken-out by an immediate spool of radius: 50 mm. Here, in the annealing and winding process, the radii of all of sheaves (pulleys) using for changing paths of the wires are 9 mm. A fracture elongation percentage $E_L$, Young's modulus (Pa) E, and 0.2% proof strength (Pa) $\sigma_{0.2}$ were measured by winding by a spool having a radius of 25 mm by 2000 m the wire taken-out by the immediate spool and removing the tip of the wire by 15 m, and $\sigma_{0.2}/E$ was calculated. The results were indicated in Tables 4 to 6. The number of samples is five in each of the measurement, thereby obtaining an average value. The wires 1 to 27 according to the invention, the comparative wires 1 to 19, and the related art wire 1 having the component compositions indicated in Tables 1 to 3 and the mechanical properties indicated in Tables 4 to 6 were set in wire bond (maxam plus) manufactured by Kulicke & Soffa, and the bonding was performed on the substrate in which IC chips of the semiconductor were mounted under the conditions of heating temperature: 150° C., the length of loop: 5 mm, the height of loop: 220 μm, the diameter of a compression ball: 34 μm, and the height of the compression ball: 8 μm. The straightness, initial bonding ability, roundness of the compression ball and bonding reliability with respect to the wires 1 to 27 according to the invention, the comparative wires 1 to 19, and the related art wire 1 were estimated by following measurements.

Straightness Estimation:

10000 loops were manufactured at a pad pitch distance of 45 μm with respect to each of the samples, and the number (contacting number) of places for contacting between the neighboring loops was measured. Accordingly, the straightness was estimated by indicating the results in Tables 4 to 6.

Initial Bondability Estimation:

10000 loops attached to each of the samples were manufactured, and the number (number of times ball lifts) of times that the compression ball is not bonded to the Al pad during the bonding of balls was measured. Accordingly, the initial bonding ability was estimated by indicating the results in Tables 4 to 6.

Compression Ball Roundness Estimation:

By observing 100 compression balls with respect to each of the samples, when all of them are good, it indicates as "◯", and even though one bad exists, it indicates as "x". Accordingly, the roundness was estimated by indicating the results in Tables 4 to 6.

Bonding Reliability Estimation:

After holding for 1000 hours in air of 175° C., 100 proof tests with respect to each sample were conducted by hanging a tool on a bending part (kink) of the loop directly on the compression ball. The fracture in the proof tests is referred to as a fracture (ball lift) in the bonding interface of the compression ball and Al pad. By observing the compression balls, when all the fractures were occurred in a neck, it was estimated as "◯", and even though one ball lift exists, it was estimated as "x".

Further, the height of loop and the resin flowability resistance with respect to the wires 1 to 27 according to the invention, the comparative wires 1 to 19, and the related art wire 1, having the component compositions indicated in Tables 1 to 3 and the mechanical properties indicated in Tables 4 to 6, were estimated.

Height of Loop:

The wires 1 to 27 according to the invention, the comparative wires 1 to 19, and the related art wire 1, having the component compositions indicated in Tables 1 to 3 and the mechanical properties indicated in Tables 4 to 6, were set in the wire bond (maxam plus) manufactured by Kulicke & Soffa, and the looping were mounted was performed under the conditions of the diameter of the compression ball: 34 μm, the height of the compression ball: 8 μm, and the length of loop: 1 mm without doing not reverse. The highest part of the loop and the height of the area of Al pad were measured by a light microscope, and the difference of the highest part of the loop and the height of the area of Al pad was obtained as the height of loop. Accordingly, the height of loop was estimated by indicating the results in Tables 4 to 6.

Resin Flowability Resistance:

After sealing with an epoxy resin the substrate in which the bonded IC chips of the semiconductor were mounted under the condition of the length of loop: 3.5 mm by using a molding apparatus, the inside of the semiconductor chip was X-ray projected by using a soft X-ray non-destruction inspection system and the flowing rates where the maximum portion of the wire flow were measured at 20 times. By dividing the average value of the measured flow rates by the length of loop, the obtained value (%) was defined as a resin flow, and the resin flow was measured. Accordingly, the resin flowability resistance was estimated by indicating the results in Tables 4 to 6.

TABLE 1

| | | Component Composition of Gold Alloy Wire (Mass ppm) | | | | | | | | | |
|---|---|---|---|---|---|---|---|---|---|---|---|
| Wire | | Pt | Pd | Ir | Ca | Be | Eu | La | Ag | Au | Ca + Eu + Be + La |
| The present invention | 1 | 1000 | — | 50 | 60 | 10 | 50 | — | — | Balance | 120 |
| | 2 | 3000 | — | 50 | 60 | 10 | 50 | — | — | Balance | 120 |
| | 3 | 4950 | — | 50 | 60 | 10 | 50 | — | — | Balance | 120 |
| | 4 | — | 1000 | 50 | 60 | 10 | 50 | — | — | Balance | 120 |
| | 5 | — | 3000 | 50 | 60 | 10 | 50 | — | — | Balance | 120 |
| | 6 | — | 4950 | 50 | 60 | 10 | 50 | — | — | Balance | 120 |
| | 7 | 500 | 500 | 50 | 60 | 10 | 50 | — | — | Balance | 120 |
| | 8 | 1500 | 1500 | 50 | 60 | 10 | 50 | — | — | Balance | 120 |
| | 9 | 2490 | 2490 | 50 | 60 | 10 | 50 | — | — | Balance | 120 |
| | 10 | 1500 | 1500 | 1 | 60 | 10 | 50 | — | — | Balance | 120 |
| | 11 | 1500 | 1500 | 200 | 60 | 10 | 50 | — | — | Balance | 120 |
| | 12 | 1500 | 1500 | 50 | 20 | 10 | 50 | — | — | Balance | 80 |
| | 13 | 1500 | 1500 | 50 | 100 | 10 | 50 | — | — | Balance | 160 |
| | 14 | 1500 | 1500 | 50 | 60 | — | 50 | — | — | Balance | 110 |
| | 15 | 1500 | 1500 | 50 | 60 | 20 | 50 | — | — | Balance | 130 |
| | 16 | 1500 | 1500 | 50 | 60 | 10 | 10 | — | — | Balance | 80 |
| | 17 | 1500 | 1500 | 50 | 60 | 10 | 100 | — | — | Balance | 170 |
| | 18 | 1500 | 1500 | 50 | 60 | 10 | 50 | 10 | — | Balance | 130 |
| | 19 | 1500 | 1500 | 50 | 60 | 10 | 50 | 50 | — | Balance | 170 |
| | 20 | 1500 | 1500 | 50 | 60 | 10 | 50 | 100 | — | Balance | 220 |

TABLE 2

| | | Component Composition of Gold Alloy Wire (Mass ppm) | | | | | | | | | |
|---|---|---|---|---|---|---|---|---|---|---|---|
| Wire | | Pt | Pd | Ir | Ca | Be | Eu | La | Ag | Au | Ca + Eu + Be + La |
| The present invention | 21 | 1500 | 1500 | 50 | 60 | 10 | 50 | — | — | Balance | 120 |
| | 22 | 1500 | 1500 | 50 | 60 | 10 | 50 | — | 5 | Balance | 120 |
| | 23 | 1500 | 1500 | 50 | 60 | 10 | 50 | — | 10 | Balance | 120 |
| | 24 | 1500 | 1500 | 50 | 30 | — | 20 | — | — | Balance | 50 |
| | 25 | 1500 | 1500 | 50 | 80 | 10 | 80 | 80 | — | Balance | 250 |
| | 26 | 1500 | 1500 | 50 | 60 | 10 | 50 | — | — | Balance | 120 |
| | 27 | 1500 | 1500 | 50 | 60 | 10 | 50 | — | — | Balance | 120 |
| Comparative | 1 | 700* | — | 50 | 60 | 10 | 50 | — | — | Balance | 120 |
| | 2 | 7000* | — | 50 | 60 | 10 | 50 | — | — | Balance | 120 |
| | 3 | — | 700* | 50 | 60 | 10 | 50 | — | — | Balance | 120 |
| | 4 | — | 7000* | 50 | 60 | 10 | 50 | — | — | Balance | 120 |

TABLE 2-continued

| | Component Composition of Gold Alloy Wire (Mass ppm) | | | | | | | | | |
|---|---|---|---|---|---|---|---|---|---|---|
| Wire | Pt | Pd | Ir | Ca | Be | Eu | La | Ag | Au | Ca + Eu + Be + La |
| 5 | 350* | 350* | 50 | 60 | 10 | 50 | — | — | Balance | 120 |
| 6 | 3500* | 3500* | 50 | 60 | 10 | 50 | — | — | Balance | 120 |
| 7 | 1500 | 1500 | —* | 60 | 10 | 50 | — | — | Balance | 120 |
| 8 | 1500 | 1500 | 300* | 60 | 10 | 50 | — | — | Balance | 120 |
| 9 | 1500 | 1500 | 50 | 10* | 10 | 50 | — | — | Balance | 70 |
| 10 | 1500 | 1500 | 50 | 120* | 10 | 50 | — | — | Balance | 180 |
| 11 | 1500 | 1500 | 50 | 60 | 30* | 50 | — | — | Balance | 140 |
| 12 | 1500 | 1500 | 50 | 60 | 10 | 4* | — | — | Balance | 74 |

*means a value out of the range of the present invention

TABLE 3

| | | Component Composition of Gold Alloy Wire (Mass ppm) | | | | | | | | | |
|---|---|---|---|---|---|---|---|---|---|---|---|
| | Wire | Pt | Pd | Ir | Ca | Be | Eu | La | Ag | Au | Ca + Eu + Be + La |
| Comparative | 13 | 1500 | 1500 | 50 | 60 | 10 | 120* | — | — | Balance | 190 |
| | 14 | 1500 | 1500 | 50 | 60 | 10 | 50 | 120* | — | Balance | 240 |
| | 15 | 1500 | 1500 | 50 | 60 | 10 | 50 | — | 20* | Balance | 120 |
| | 16 | 1500 | 1500 | 50 | 20 | — | 10 | — | — | Balance | 30* |
| | 17 | 1500 | 1500 | 50 | 90 | 15 | 90 | 90 | — | Balance | 285* |
| | 18 | 1500 | 1500 | 50 | 60 | 10 | 50 | — | — | Balance | 120 |
| | 19 | 1500 | 1500 | 50 | 60 | 10 | 50 | — | — | Balance | 120 |
| The Related Art 1 | | 1500 | 1500 | 50 | 20 | 10 | Y:20 | — | — | Balance | — |

*means a value out of the range of the present invention

TABLE 4

| | | | Mechanical Property | | | | The number of contacts (Piece) | Number of ball lifts (Piece) | Roundness of Compression Ball | Bonding Reliability | Resin flowability (%) | Height of Loop (μm) |
|---|---|---|---|---|---|---|---|---|---|---|---|---|
| | Wire | Annealing Temperature (°C.) | Fracture Elongation Percentage $E_L$(%) | Young's modulus E(GPa) | $\sigma_{0.2}/E \times 10^{-3}$ | $\sigma_{0.2}$ (MPa) | | | | | | |
| The present invention | 1 | 520 | 4.3 | 84 | 2.4 | 204 | 21 | 0 | ○ | ○ | 2.5 | 74 |
| | 2 | 518 | 4.0 | 87 | 2.4 | 209 | 22 | 0 | ○ | ○ | 2.4 | 72 |
| | 3 | 520 | 4.2 | 90 | 2.5 | 224 | 17 | 0 | ○ | ○ | 2.6 | 75 |
| | 4 | 521 | 4.1 | 84 | 2.5 | 207 | 15 | 0 | ○ | ○ | 2.6 | 75 |
| | 5 | 521 | 4.3 | 88 | 2.6 | 228 | 23 | 0 | ○ | ○ | 2.4 | 71 |
| | 6 | 518 | 4.4 | 91 | 2.4 | 221 | 16 | 0 | ○ | ○ | 2.6 | 72 |
| | 7 | 522 | 4.0 | 88 | 2.6 | 227 | 23 | 0 | ○ | ○ | 2.6 | 75 |
| | 8 | 522 | 4.4 | 89 | 2.5 | 220 | 23 | 0 | ○ | ○ | 2.6 | 75 |
| | 9 | 519 | 4.0 | 90 | 2.4 | 218 | 19 | 0 | ○ | ○ | 2.5 | 73 |
| | 10 | 520 | 4.0 | 89 | 2.4 | 217 | 16 | 0 | ○ | ○ | 2.4 | 77 |
| | 11 | 521 | 4.3 | 88 | 2.4 | 216 | 24 | 0 | ○ | ○ | 2.4 | 71 |
| | 12 | 509 | 4.1 | 77 | 2.3 | 177 | 25 | 0 | ○ | ○ | 3.2 | 77 |
| | 13 | 536 | 4.1 | 91 | 2.9 | 262 | 15 | 0 | ○ | ○ | 2.1 | 69 |
| | 14 | 530 | 4.2 | 87 | 2.5 | 218 | 17 | 0 | ○ | ○ | 2.7 | 63 |
| | 15 | 512 | 4.1 | 91 | 2.9 | 262 | 11 | 0 | ○ | ○ | 2.2 | 85 |
| | 16 | 511 | 4.0 | 84 | 2.4 | 206 | 25 | 0 | ○ | ○ | 2.7 | 79 |
| | 17 | 531 | 4.1 | 92 | 2.8 | 262 | 7 | 0 | ○ | ○ | 2.1 | 69 |
| | 18 | 520 | 4.0 | 88 | 2.5 | 223 | 22 | 0 | ○ | ○ | 2.5 | 72 |

TABLE 5

| | | | Mechanical Property | | | | The number of contacts (Piece) | Number of ball lifts (Piece) | Roundness of Compression Ball | Bonding Reliability | Resin flowability (%) | Height of Loop (μm) |
|---|---|---|---|---|---|---|---|---|---|---|---|---|
| | Wire | Annealing Temperature (°C.) | Fracture Elongation Percentage $E_L$(%) | Young's modulus E(GPa) | $\sigma_{0.2}/E \times 10^{-3}$ | $\sigma_{0.2}$ (MPa) | | | | | | |
| The present invention | 19 | 524 | 4.0 | 91 | 2.5 | 230 | 10 | 0 | ○ | ○ | 2.2 | 71 |
| | 20 | 528 | 4.4 | 94 | 2.8 | 267 | 6 | 0 | ○ | ○ | 2.0 | 68 |
| | 21 | 520 | 4.3 | 89 | 2.5 | 226 | 19 | 0 | ○ | ○ | 2.5 | 73 |
| | 22 | 519 | 4.2 | 89 | 2.5 | 226 | 21 | 0 | ○ | ○ | 2.6 | 73 |

TABLE 5-continued

| Wire | | Annealing Temperature (°C.) | Mechanical Property | | | | The number of contacts (Piece) | Number of ball lifts (Piece) | Roundness of Compression Ball | Bonding Reliability | Resin flowability (%) | Height of Loop (μm) |
|---|---|---|---|---|---|---|---|---|---|---|---|---|
| | | | Fracture Elongation Percentage $E_L$(%) | Young's modulus E(GPa) | $\sigma_{0.2}/E \times 10^{-3}$ | $\sigma_{0.2}$ (MPa) | | | | | | |
| | 23 | 522 | 4.0 | 88 | 2.4 | 211 | 21 | 0 | ○ | ○ | 2.7 | 72 |
| | 24 | 511 | 4.1 | 78 | 2.3 | 179 | 26 | 0 | ○ | ○ | 2.8 | 70 |
| | 25 | 530 | 4.1 | 96 | 3.0 | 290 | 5 | 0 | ○ | ○ | 2.1 | 67 |
| | 26 | 498 | 2.0 | 100 | 2.9 | 289 | 25 | 0 | ○ | ○ | 1.8 | 74 |
| | 27 | 540 | 10.0 | 80 | 2.2 | 176 | 18 | 0 | ○ | ○ | 3.2 | 75 |
| Comparative | 1 | 522 | 4.2 | 87 | 2.5 | 214 | 25 | 0 | ○ | X | 2.6 | 75 |
| | 2 | 521 | 4.1 | 89 | 2.5 | 227 | 16 | 5 | ○ | ○ | 2.7 | 71 |
| | 3 | 520 | 4.1 | 87 | 2.6 | 223 | 17 | 0 | ○ | X | 2.6 | 73 |
| | 4 | 522 | 4.1 | 89 | 2.6 | 232 | 23 | 8 | ○ | ○ | 2.4 | 74 |
| | 5 | 521 | 4.3 | 85 | 2.5 | 215 | 19 | 0 | ○ | X | 2.5 | 73 |
| | 6 | 520 | 4.1 | 90 | 2.6 | 233 | 21 | 4 | ○ | ○ | 2.5 | 73 |
| | 7 | 522 | 4.0 | 87 | 2.4 | 208 | 25 | 0 | X | ○ | 2.6 | 84 |
| | 8 | 520 | 4.0 | 89 | 2.6 | 230 | A portion of an Al pad is damaged during the bonding | | | | | |

TABLE 6

| Wire | | Annealing Temperature (°C.) | Mechanical Property | | | | The number of contacts (Piece) | The Number of ball lifts (Piece) | Roundness of Compression Ball | Bonding Reliability | Resin flowability (%) | Height of Loop (μm) |
|---|---|---|---|---|---|---|---|---|---|---|---|---|
| | | | Fracture Elongation Percentage $E_L$(%) | Young's modulus E(GPa) | $\sigma_{0.2}/E \times 10^{-3}$ | $\sigma_{0.2}$ (MPa) | | | | | | |
| Comparative | 9 | 510 | 4.3 | 73* | 2.1* | 156 | 156 | 18 | ○ | ○ | 4.2 | 89 |
| | 10 | 534 | 4.1 | 95 | 2.7 | 256 | 10 | 7 | ○ | ○ | 1.8 | 64 |
| | 11 | 511 | 4.1 | 95 | 2.8 | 269 | 11 | 4 | X | ○ | 2.4 | 91 |
| | 12 | 511 | 4.4 | 79 | 2.1* | 169 | 121 | 12 | ○ | ○ | 3.7 | 82 |
| | 13 | 531 | 4.3 | 91 | 2.7 | 249 | 14 | 4 | ○ | ○ | 2.1 | 61 |
| | 14 | 529 | 4.2 | 90 | 2.8 | 253 | 9 | 3 | ○ | ○ | 2.0 | 63 |
| | 15 | 520 | 4.2 | 89 | 2.6 | 227 | 15 | 2 | ○ | ○ | 2.4 | 75 |
| | 16 | 507 | 4.3 | 74* | 2.1* | 155 | 232 | 17 | ○ | ○ | 4.3 | 69 |
| | 17 | 537 | 4.4 | 101 | 3.1 | 310 | 6 | 3 | ○ | ○ | 1.8 | 76 |
| | 18 | 500 | 1.5* | 99 | 3.2 | 317 | 312 | 0 | ○ | ○ | 2.1 | 73 |
| | 19 | 547 | 12.0* | 73* | 2.1* | 155 | 255 | 0 | ○ | ○ | 4.2 | 75 |
| The Related Art 1 | | 509 | 4.1 | 72* | 2.1* | 151 | 154 | 25 | ○ | ○ | 4.1 | 85 |

*means a value out of the range of the present invention

It can be understood from the results indicated in Tables 1 to 6 that the wires 1 to 27 according to the invention have the excellent straightness, initial bonding ability, roundness of the compression ball, bonding reliability, resin flowability resistance, and more particularly, with respect to the excellent straightness, initial bonding ability, bonding reliability, roundness of the compression ball, and resin flowability resistance, the comparative wires 1 to 19 and the related art wire 1 have a defect of at least one of the above-described properties.

What is claimed is:

1. A gold alloy wire for a bonding wire having high initial bonding ability, high bonding reliability, high roundness of a compression ball, high straightness, and high resin flowability resistance,
    the gold alloy wire having a component composition consisting of at least one Pt and Pd of 1000 ppm or more to less than 5000 ppm in total, Ir: 1 to 200 ppm, Ca: 20 to 100 ppm, Eu: 10 to 100 ppm, Be: 0.1 to 20 ppm, La: 10 to 100 ppm, Ag: 1 to 10 ppm, and a balance being Au and inevitable impurities.

2. The gold alloy wire for the bonding wire having high initial bonding ability, high bonding reliability, high roundness of the compression ball, high straightness, and high resin flowability according to claim 1,
    Wherein, when 0.2% proof strength (Pa) of gold alloy wire for the bonding wire is $\sigma_{0.2}$, Young's modulus (Pa) is E, and fracture elongation percentage is $E_L$, the following equations are satisfied $E \geq 75$ GPa;

$(\sigma_{0.2}/E) \geq 2.2 \times 10^{-3}$; and $2\% \leq E_L \leq 10\%$.

* * * * *